United States Patent
Nomaguchi

(10) Patent No.: US 8,038,893 B2
(45) Date of Patent: Oct. 18, 2011

(54) METHOD FOR PRODUCING SEMICONDUCTOR OPTICAL DEVICE

(75) Inventor: Toshio Nomaguchi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 828 days.

(21) Appl. No.: 12/081,249

(22) Filed: Apr. 14, 2008

(65) Prior Publication Data

US 2009/0181522 A1 Jul. 16, 2009

(30) Foreign Application Priority Data

May 31, 2007 (JP) .............................. P2007-145495

(51) Int. Cl.
- B44C 1/22 (2006.01)
- C03C 15/00 (2006.01)
- C03C 25/68 (2006.01)
- C23F 1/00 (2006.01)

(52) U.S. Cl. .............................. 216/41; 216/24; 438/745

(58) Field of Classification Search .................... 216/24, 216/41; 438/745
See application file for complete search history.

(56) References Cited

U.S. PATENT DOCUMENTS

2005/0186800 A1* 8/2005 Brewer .......................... 438/694

FOREIGN PATENT DOCUMENTS

JP 9-51143 2/1997

* cited by examiner

Primary Examiner — Roberts Culbert
(74) Attorney, Agent, or Firm — Smith, Gambrell & Russell, LLP

(57) ABSTRACT

To grasp a removable particle contamination and appropriately removing a particle contamination exposing from a surface of a semiconductor layer, this production method of the semiconductor optical device includes a surface treatment step in which particle contaminations removed from a surface of a cap layer 5 by etching are limited to particle contaminations A1, C2 higher than the thickness of a resist layer 22 formed on the surface of the cap layer 5. Therefore, the heights of removable particle contaminations can be preliminarily grasped based on the thickness of the resist layer 22 formed, whereby the particle contaminations exposing from the surface of the cap layer 5 can be appropriately removed by etching just enough. By repeating steps S11-S17 while changing the thickness of the resist layer 22, it is feasible to prevent unnecessary etching of a wafer and to remove the particle contaminations more completely.

5 Claims, 8 Drawing Sheets

(a)

(b)

(c)

(a)

(b)

(c)

(a)

(b)

(c)

(a)

(b)

(c)

METHOD FOR PRODUCING SEMICONDUCTOR OPTICAL DEVICE

BACKGROUND OF THE INVENTION

1. Field of the Invention

The present invention relates to a method for producing a semiconductor optical device.

2. Related Background Art

Crystal growth like the metalorganic chemical vapor deposition (MOCVD) is widely used for forming each of semiconductor layers constituting a semiconductor optical device. In this crystal growth, there are cases where undesirable particle contaminations (flakes) originating from products or the like adhering to an inner wall or the like of a growth furnace appear on surfaces of the semiconductor layers. If semiconductor layers are further deposited on such flakes, particle contaminations might abnormally grow with the flakes as nuclei.

If the production process is advanced with the particle contaminations being left as they are, they could cause such inconvenience that the After removing the insulating layer 6 and the cap layer 5, the third epitaxial growth step is done particle contaminations hit a mask used in photolithography to crack a wafer, or that broken particle contaminations scatter to contaminate the surfaces of the semiconductor layers. For avoiding it, for example, Patent Document 1 describes a production method of a semiconductor optical device in which the surface of the wafer is treated with nitric acid after the first epitaxial crystal growth by MOCVD, to remove the particle contaminations from the surface of the semiconductor layer. It also describes that etching of the wafer itself is prevented by providing a dummy layer on the surface of the semiconductor layer prior to the nitric acid treatment (cf. FIG. 5 in Patent Document 1).

[Patent Document 1] Japanese Patent Application Laid-open No. 9-51143

SUMMARY OF THE INVENTION

Problem to be Solved by the Invention

In the production process of the semiconductor optical device, it is difficult to actually check how much the particle contaminations are exposing from the surface of the formed semiconductor layer. It is hard to grasp the degree of removal of the particle contaminations by such a technique as the aforementioned conventional production method of the semiconductor optical device and it is thus difficult to perform the surface treatment of the semiconductor layer just enough. If the surface treatment is too little the particle contaminations will not be completely removed; if the surface treatment is too much the wafer could be etched unnecessarily.

The present invention has been accomplished in order to solve the above problem and an object of the invention is to provide a production method of a semiconductor optical device capable of permitting us to grasp a removable particle contamination and appropriately removing a particle contamination exposing from a surface of a semiconductor layer.

Means for Solving the Problem

In order to solve the above problem, a production method of a semiconductor optical device according to the present invention is a method for producing a semiconductor optical device, the method comprising: a semiconductor layer growing step of epitaxially growing a plurality of semiconductor layers on one side of a semiconductor substrate; a mask layer forming step of forming a mask layer in a predetermined thickness on an outermost surface of the semiconductor layers so as to expose a tip side of a particle contamination exposing from the outermost surface; a particle contamination removing step of etching the particle contamination with a predetermined etchant, using the mask layer; and a mask layer removing step of removing the mask layer from the outermost surface, after etching the particle contamination.

In this production method of the semiconductor optical device, the mask layer is formed in the predetermined thickness so as to expose the tip side of the particle contamination exposing from the outermost surface of the semiconductor layers, and the particle contamination is etched using this mask layer. The particle contamination removed in the particle contamination removing step is limited to a particle contamination higher than the thickness of the mask layer formed on the outermost surface of the semiconductor layers in the mask layer forming step. Therefore, this production method of the semiconductor optical device permits us to preliminarily grasp the height of the removable particle contamination, based on the thickness of the mask layer formed, whereby the particle contamination exposing from the outermost surface of the semiconductor layers can be appropriately removed by the surface treatment just enough.

Preferably, the mask layer forming step comprises a step of applying a resist layer in a predetermined thickness on the outermost surface of the semiconductor layers by a spinner, and the particle contamination removing step comprises etching the particle contamination with the predetermined etchant, using the resist layer as the mask layer. The inventors discovered that when the resist layer was applied by the spinner, the resist layer was rarely applied on the tip side of the particle contamination. Therefore, this method enables the tip side of the particle contamination to be readily exposed from the resist layer. In addition, the thickness of the resist layer can be readily adjusted by controlling a rotation rate of the spinner.

Preferably, the mask layer forming step comprises: a step of forming an insulating layer on the outermost surface of the semiconductor layers so as to cover the particle contamination; a step of applying a resist layer in a predetermined thickness on the insulating layer by a spinner so as to expose the tip side of the particle contamination covered by the insulating layer; and a step of etching the insulating layer, using the resist layer as a mask, to expose the tip side of the particle contamination from the insulating layer, and the particle contamination removing step comprises removing the resist layer and thereafter etching the particle contamination with the predetermined etchant, using the insulating layer as the mask layer. This method also permits the tip side of the particle contamination covered by the insulating layer, to be readily exposed from the resist layer. In addition, the thickness of the resist layer can be readily adjusted by controlling the rotation rate of the spinner. Furthermore, this method improves etching resistance of the wafer.

Preferably, the mask layer forming step further comprises a step of descumming the tip side of the particle contamination, after forming the resist layer. In this case, the tip side of the particle contamination is exposed more definitely from the resist layer.

Preferably, the mask layer forming step, the particle contamination removing step, and the mask layer removing step are repeated a plurality of times while stepwise decreasing the thickness of the mask layer formed on the outermost surface. When this method is applied to a case where there are particle contaminations exposing at different heights from the outermost surface of the semiconductor layers, it can appropriately remove these particle contaminations.

The production method of semiconductor optical device according to the present invention permits us to grasp a removable particle contamination and to appropriately remove the particle contamination exposing from the surface of the semiconductor layer.

DESCRIPTION OF REFERENCE SYMBOLS 1 semiconductor substrate; 3 active layer; 5 cap layer; 21 insulating layer; 22 resist layer; A1, A2, B1, B2, C1, C2 particle contaminations.

DESCRIPTION OF THE PREFERRED EMBODIMENTS

The preferred embodiment of the production method of the semiconductor optical device according to the present invention will be described below in detail with reference to the drawings.

Figure 1:
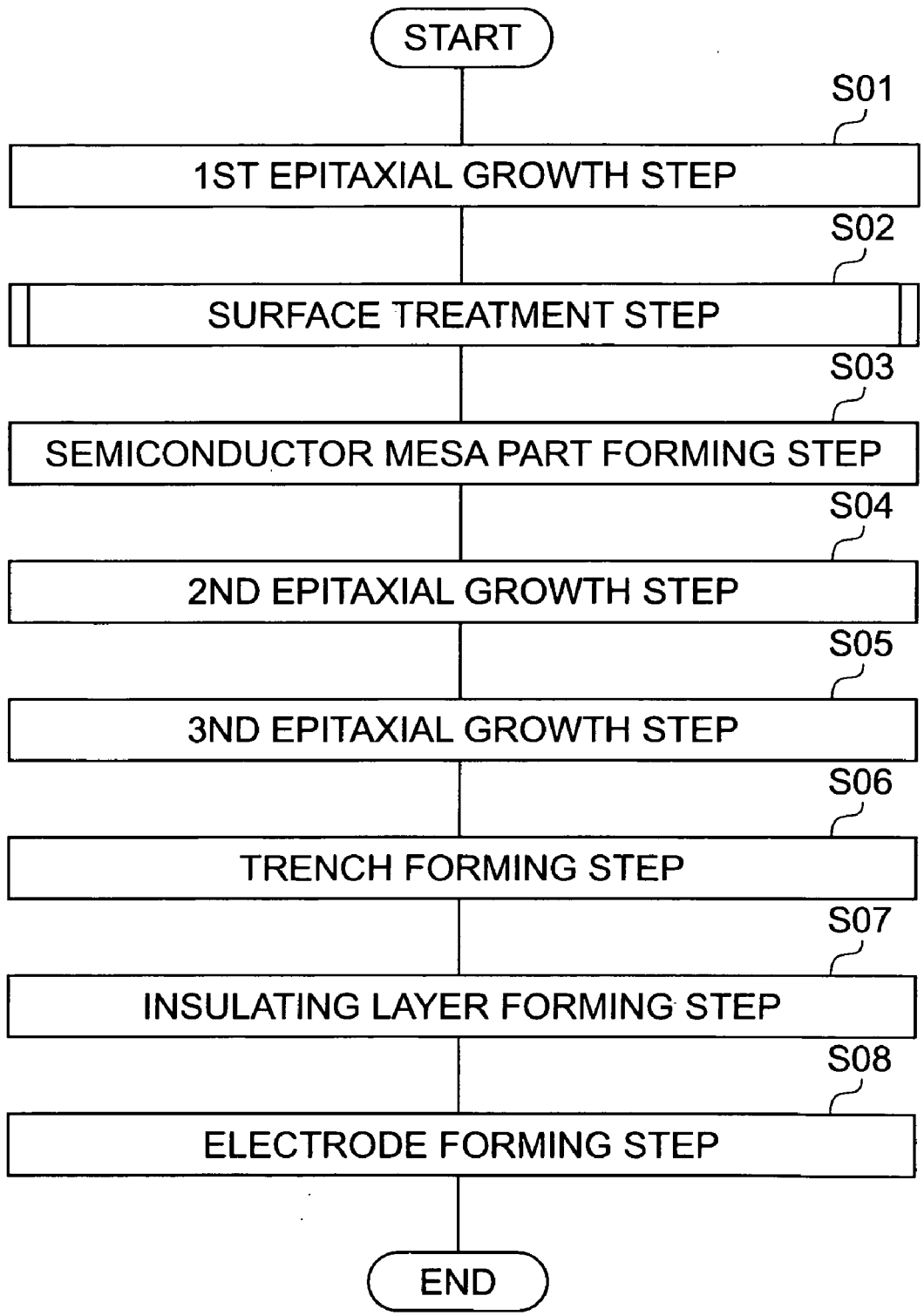
FIG. 1 is a step diagram showing a production method of a semiconductor optical device according to an embodiment of the present invention.

FIG. 1 is a step diagram showing the production method of the semiconductor optical device according to an embodiment of the present invention. As shown in FIG. 1, this production method of the semiconductor optical device is comprised of a first epitaxial growth step (step S01), a surface treatment step (step S02), a semiconductor mesa part forming step (step S03), a second epitaxial growth step (step S04), a third epitaxial growth step (step S05), a trench forming step (step S06), an insulating layer forming step (step S07), and an electrode forming step (step S08).

Figure 2:
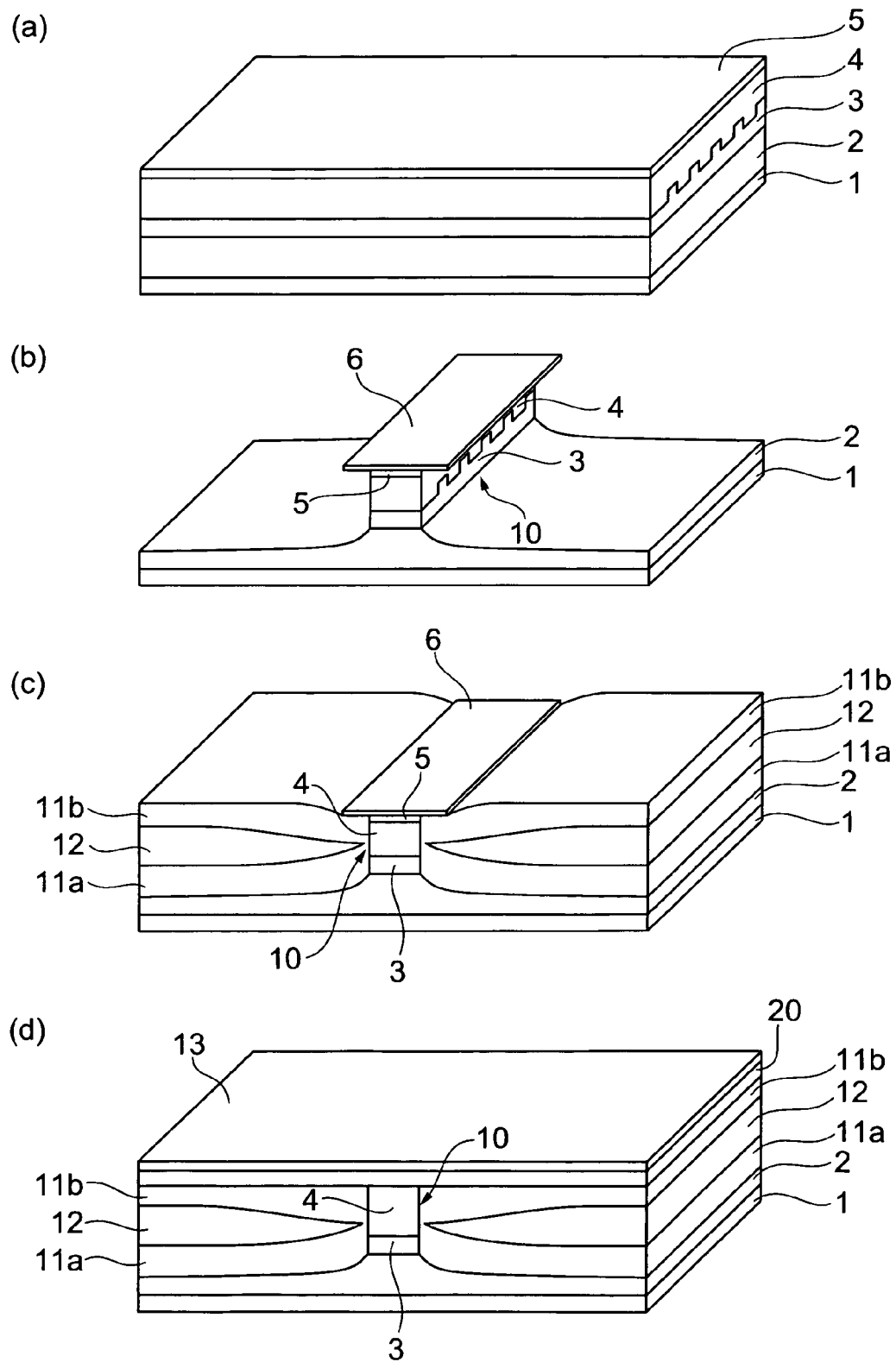
FIG. 2 is a drawing showing a production process of the semiconductor optical device in the production method shown in FIG. 1.

The first epitaxial step is, as shown in FIG. 2(a), to sequentially epitaxially grow a lower cladding layer 2 of InP of the n conductivity type, an active layer 3, an upper cladding layer 4 of InP of the p conductivity type, and a cap layer 5 of GaInAs on one side of a semiconductor substrate 1 of InP of the n conductivity type in a growth furnace. For example, the metalorganic chemical vapor deposition (MOCVD) is applied to the epitaxial growth of each of the semiconductor layers 2, 3, 4, and 5.

The surface treatment step is to perform a surface treatment of the outermost surface of the semiconductor layers formed in the first epitaxial step, i.e., a surface treatment of the cap layer 5. In the first epitaxial step, particle contaminations (flakes) originating from Ga, In, As, P, and bound substances thereof adhering to the inner wall of the growth furnace or the like could appear on the surfaces of the semiconductor layers. If semiconductor layers are further deposited on flakes, particle contaminations might abnormally grow with the flakes as nuclei. In the surface treatment step, therefore, the particle contaminations appearing on the semiconductor layers 2, 3, 4, 5 are removed by the surface treatment of the cap layer 5. The details of the surface treatment step will be described later.

The semiconductor mesa part forming step is to deposit an insulating layer 6, e.g., of SiN on the entire surface of the cap layer 5 and to shape the insulating layer 6 in a stripe pattern with the width of about 3 μm by photolithography. Then wet etching, for example, with bromine-methyl alcohol is carried out using the insulating layer 6 of the stripe pattern as a mask, to form a semiconductor mesa part 10, as shown in FIG. 2(b).

The second epitaxial growth step is, as shown in FIG. 2(c), to sequentially form a buried layer 11a of InP of the p conductivity type, a buried layer 12 of InP of the n conductivity type, and a buried layer 11b of InP of the p conductivity type so as to cover the sides of the semiconductor mesa part 10, for example, by MOCVD. The semiconductor mesa part 10 becomes buried by the buried layers 11a, 11b, 12 and the element becomes flattened.

After removing the insulating layer 6 and the cap layer 5, the third epitaxial growth step is done. The third epitaxial growth step is, as shown in FIG. 2(d), to deposit an InP layer 20 and a contact layer 13 of GaInAs of the p conductivity type on the upper surfaces of the semiconductor mesa part 10 and the buried layer 11b, for example, by MOCVD. The trench forming step is, as shown in FIG. 3(a), to form trenches 14, 14 for separation between adjacent elements, along the forming direction of the semiconductor mesa part 10.

The insulating layer forming step is to form an insulating layer 15, for example, of SiO2 on the upper surface of the contact layer 13 and on inner wall surfaces of the trenches 14, 14. Furthermore, a predetermined resist layer is formed on the surface of the insulating layer 15. Then, as shown in FIG. 3(b), an aperture 15a of a stripe pattern with the width of about 3 μm is formed in the insulating layer 15 by photolithograph using the resist layer as a mask, to expose the upper surface of the contact layer 13 from the insulating layer 15.

Figure 3:
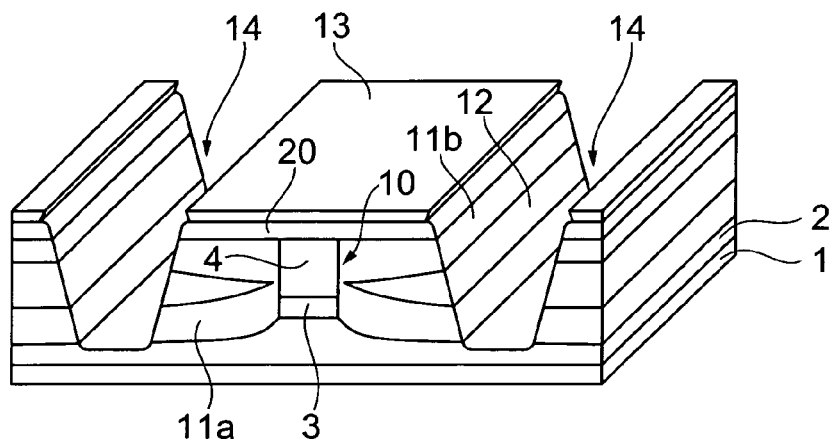
FIG. 3 is a drawing showing a process subsequent to FIG. 2.
Figure 3:
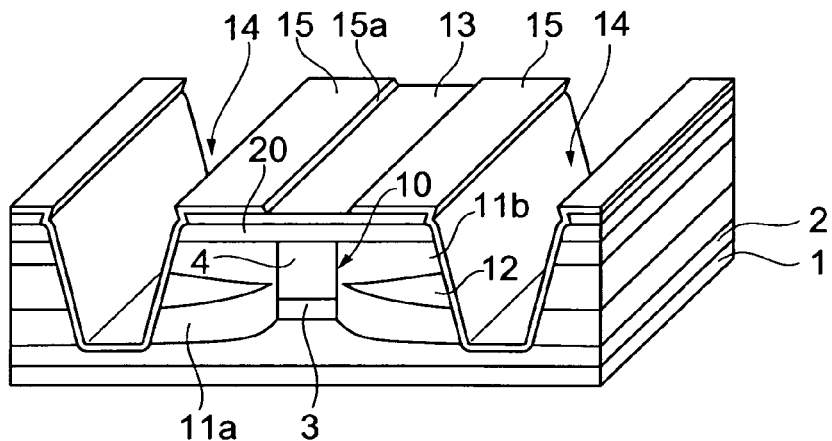
Figure 3:
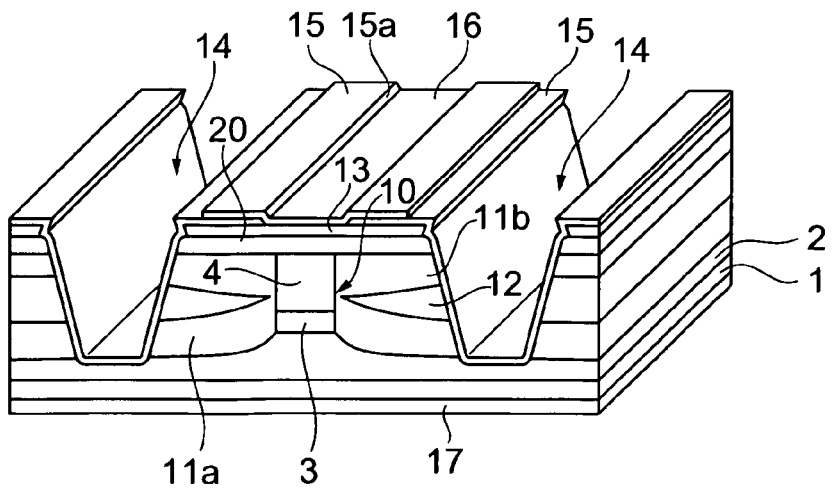

The electrode forming step is to form a surface electrode 16 of a stripe pattern on the insulating layer 15 so as to cover the aperture 15a, as shown in FIG. 3(c). A back electrode 17 is also formed on the other side of the semiconductor substrate 1.

The aforementioned surface treatment step will be described below in further detail.

Figure 4:
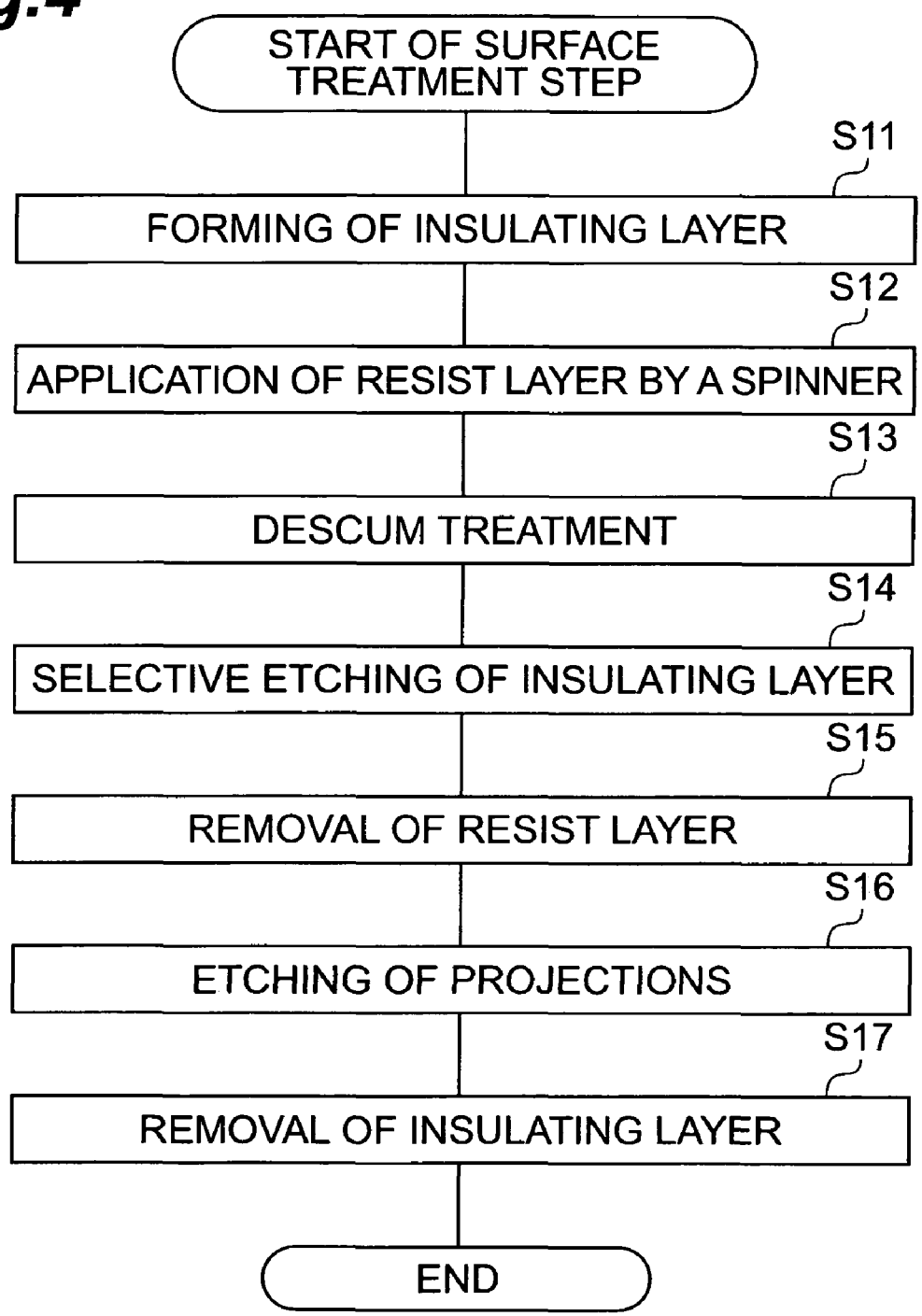
FIG. 4 is a step diagram showing the details of a surface treatment step.
Figure 5:
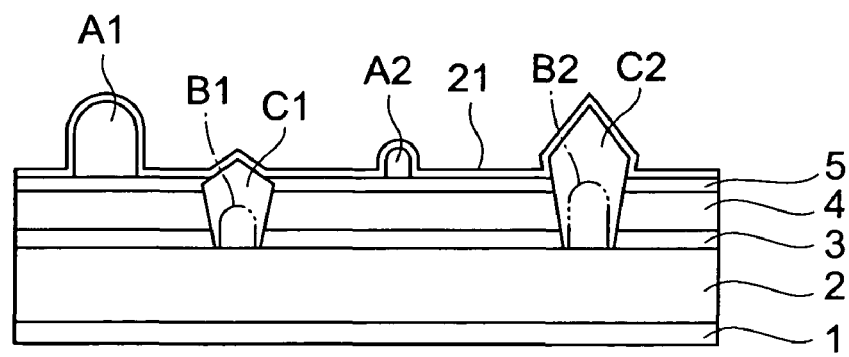
FIG. 5 is a drawing schematically showing surface conditions of semiconductor layers in the surface treatment step shown in FIG. 4.
Figure 5:
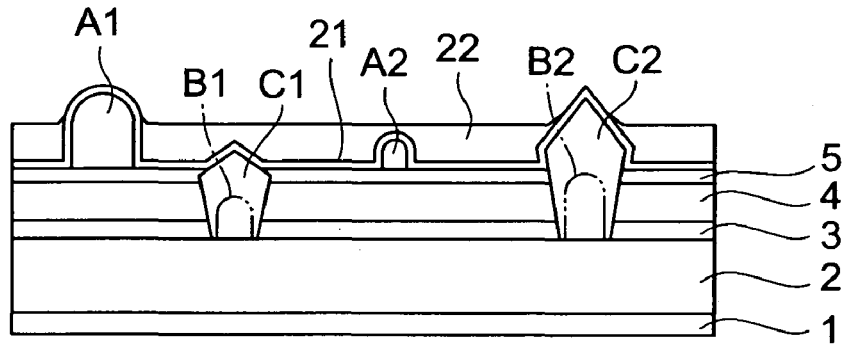
Figure 5:
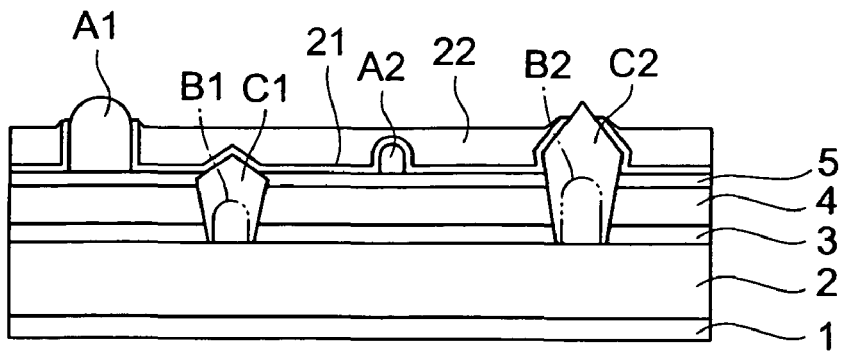
Figure 6:
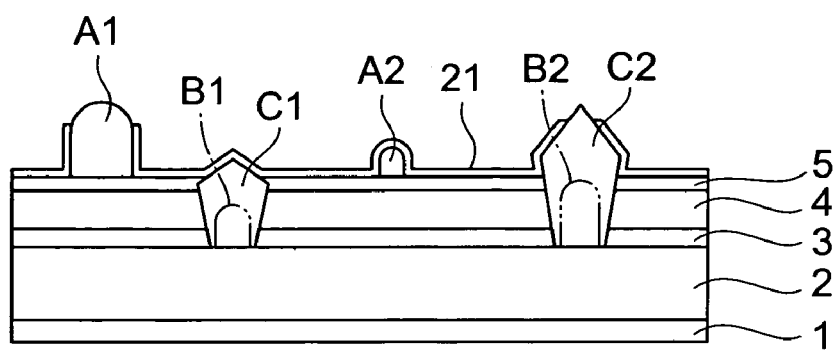
FIG. 6 is a drawing schematically showing surface conditions subsequent to FIG. 5.
Figure 6:
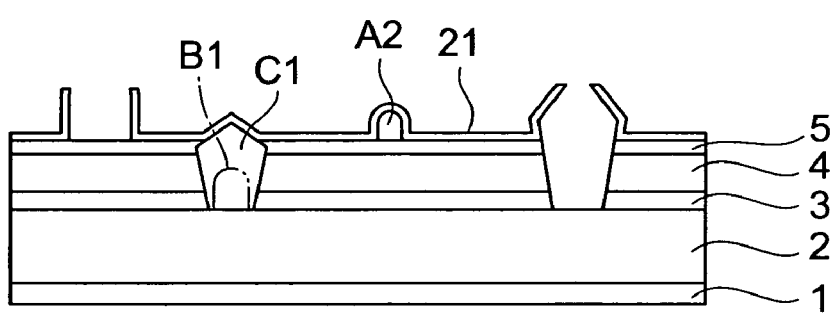
Figure 6:
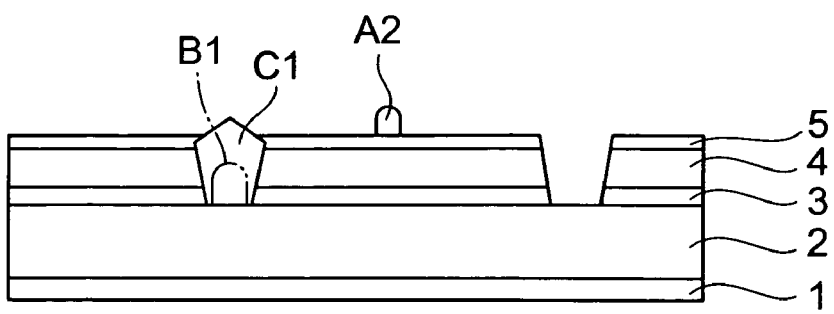

FIG. 4 is a step diagram showing the details of the surface treatment step. FIGS. 5 and 6 are drawings schematically showing surface conditions of the semiconductor layers in the surface treatment step. FIGS. 5 and 6 illustrate particle contaminations A1, A2 adhering to the surface of the cap layer 5, and particle contaminations C1, C2 abnormally grown above the surface of the cap layer 5 with particle contaminations B1, B2 adhering to the surface of the lower cladding layer 2, as nuclei. The heights of the particle contaminations A1, C2 from the surface of the cap layer 5 are, for example, 20 μm and the heights of the particle contaminations A2, C1 from the surface of the cap layer 5 are, for example, 3 μm.

First, an insulating layer 21, for example, of SiN is formed in the thickness of about 0.1 μm over the entire surface of the cap layer 5 (step S11). This causes the insulating layer 21 to cover each of the particle contaminations A1, A2, C1, C2, as shown in FIG. 5(a). Next, a resist layer 22, for example, of a novolac-based material is applied onto the surface of the insulating layer 21 by a spinner (step S12). The thickness of the resist layer 22 is, for example, approximately 5 µm. This step results in exposing the tip sides of the particle contaminations A1, C2 higher than the thickness of the resist layer 22 from resist layer 22 and burying the particle contaminations A2, C1 lower than the thickness of the resist layer 22 in the resist layer 22, among the particle contaminations A1, A2, C1, C2 covered by the insulating layer 21, as shown in FIG. 5(b).

After the resist layer 22 is formed, a descum treatment is performed, for example, by parallel plate type RIE (step S13). The conditions for the descum treatment are, for example, the oxygen flow rate of 50 sccm, the pressure of 1 Pa, and RF of 50 W. The descum treatment can remove the resist layer even if the resist layer is formed in a small thickness over the insulating layer 21 on the tip sides of the particle contaminations A1, C2. It can also finely adjust the thickness of the resist layer 22.

Next, the insulating layer 21 is selectively etched, for example, with hydrofluoric acid, using the resist layer 22 as a mask (step S14). This step results in removing the parts of the insulating layer 21 covering the tip sides of the particle contaminations A1, C2 exposed from the resist layer 22, as shown in FIG. 5(c).

After completion of the selective etching of the insulating layer 21, the resist layer 22 on the insulating layer 21 is removed, for example, with an organic solvent such as acetone, as shown in FIG. 6(a) (step S15). After the resist layer 22 is removed, the particle contaminations are etched using the remaining insulating layer 21 as a mask (step S16). This step results in removing each of the particle contaminations A1, C2 higher than the thickness of the resist layer 22, as shown in FIG. 6(b).

An etchant to be used for the etching of the particle contaminations is, for example, bromine-methyl alcohol. It is also possible to alternately use a hydrochloric acid etchant (HCl:H2O=1:1) and a sulfuric acid etchant (H2SO4:H2O2:H2O=5:1:40). After this, the insulating layer 21 remaining on the surface of the cap layer 5 is removed again with hydrofluoric acid, as shown in FIG. 6(c) (step S17).

The steps S11-S17 are thus completed to selectively remove only the particle contaminations A1, C2 higher than the thickness of the resist layer 22. The remaining particle contaminations A2, C1 can be removed by repeating the aforementioned steps S11-S17 while setting the thickness of the resist layer 22 formed in step S12, to one smaller than 3 µm.

In the foregoing production method of the semiconductor optical device, as described above, the particle contaminations removed from the surface of the cap layer 5 by etching in the surface treatment step are limited to the particle contaminations A1, C2 higher than the thickness of the resist layer 22 formed on the surface of the cap layer 5. Therefore, the heights of the removable particle contaminations can be preliminarily grasped based on the thickness of the resist layer 22 formed, whereby the particle contaminations exposing from the surface of the cap layer 5 can be appropriately removed by the etching just enough.

By repeating the steps S11-S17 while changing the thickness of the resist layer 22, it is feasible to prevent unnecessary etching of the wafer and to remove the particle contaminations more completely. The removal of particle contaminations prevents the particle contaminations from hitting a mask used in photolithography and cracking the wafer, and prevents broken particle contaminations from scattering over the surface of the semiconductor layers.

Since the production method of the semiconductor optical device is adapted to apply the resist layer 22 by the spinner, the resist layer 22 is rarely applied onto the tip sides of the particle contaminations A1, C2 so that the tip sides of the particle contaminations A1, C2 can be readily exposed from the resist layer 22. This is made more definite by the descum treatment after the application of the resist layer 22. In the production method of the semiconductor optical device, the insulating layer 21 is interposed between the cap layer 5 and the resist layer 22, whereby etching resistance of the wafer is ensured. This widens the range of choice for the etchant used in the removal of particle contaminations.

A modification example of the surface treatment step will be described below.

Figure 7:
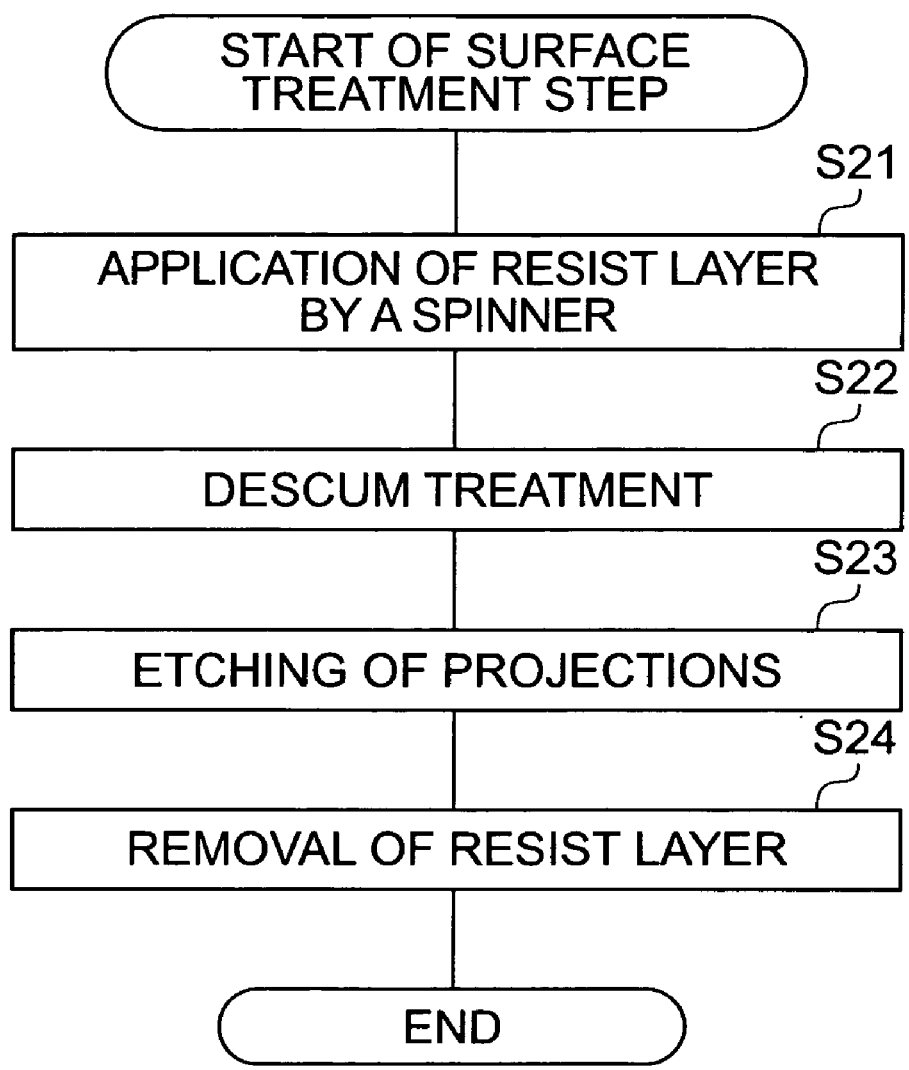
FIG. 7 is a step diagram showing the details of the surface treatment step according to a modification example.
Figure 8:
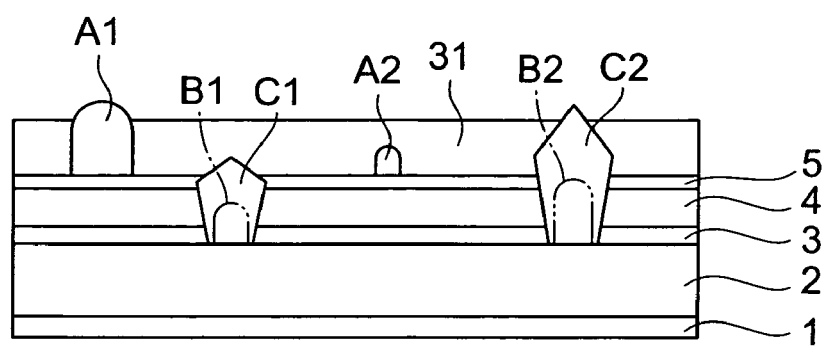
FIG. 8 is a drawing schematically showing surface conditions of semiconductor layers in the surface treatment step shown in FIG. 7.
Figure 8:
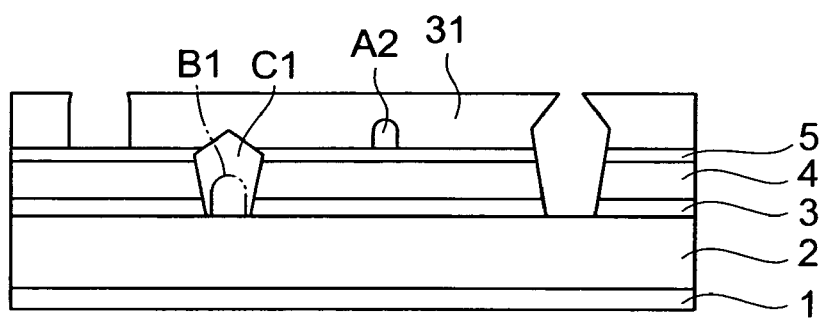
Figure 8:
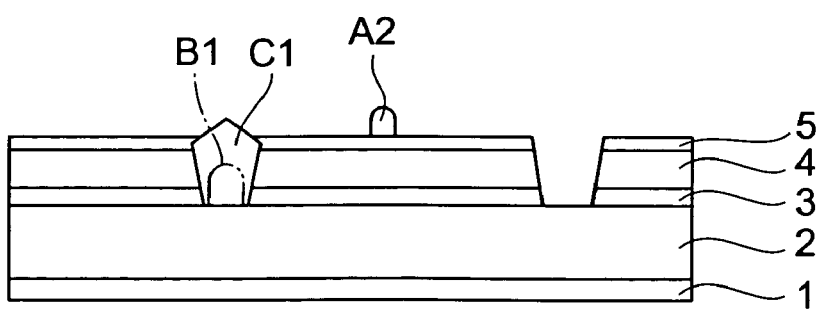

FIG. 7 is a step diagram showing the details of the surface treatment step according to the modification example. FIG. 8 is a drawing schematically showing surface conditions of the semiconductor layers in the surface treatment step shown in FIG. 7.

First, a resist layer 31, for example, of a novolac-based material is applied over the entire surface of the cap layer 5 by the spinner (step S21). The thickness of the resist layer 31 is, for example, approximately 5 µm. This step results in exposing the tip sides of particle contaminations A1, C2 higher than the thickness of the resist layer 31, from the resist layer 31 and burying the particle contaminations A2, C1 lower than the thickness of the resist layer 31, in the resist layer 31 among the particle contaminations A1, A2, C1, C2, as shown in FIG. 8(a).

After the resist layer 31 is formed, the descum treatment is performed, for example, by parallel plate type RIE (step S22). The conditions for the descum treatment are, for example, the oxygen flow rate of 50 sccm, the pressure of 1 Pa, and RF of 50 W. The descum treatment can remove the resist layer even if the resist layer is formed in a small thickness on the tip sides of the particle contaminations A1, C2. It can also finely adjust the thickness of the resist layer 31.

Next, the particle contaminations are etched using the resist layer 31 as a mask (step S23). This step results in removing each of the particle contaminations A1, C2 higher than the thickness of the resist layer 31, as shown in FIG. 8(b). An etchant to be used in the etching of particle contaminations is, for example, a hydrochloric acid etchant (HCl:H2O=1:1). After this, the resist layer 31 remaining on the surface of the cap layer 5 is removed, for example, with an organic solvent such as acetone, as shown in FIG. 8(c) (step S24).

The steps S21-S24 are thus completed to selectively remove only the particle contaminations A1, C2 higher than the thickness of the resist layer 31. The remaining particle contaminations A2, C1 can be removed by repeating the aforementioned steps S21-S24 while setting the thickness of the resist layer 31 formed in step S21, to one smaller than 3 µm.

In this surface treatment step, the particle contaminations removed from the surface of the cap layer 5 by etching are also limited to the particle contaminations A1, C2 higher than the thickness of the resist layer 31 formed on the surface of the cap layer 5. Therefore, the heights of the removable particle contaminations can be preliminarily grasped based on the thickness of the resist layer 31 formed, whereby the particle contaminations exposing from the surface of the cap layer 5 can be appropriately removed by the etching just enough.

By repeating the steps S21-S24 while changing the thickness of the resist layer 31, the unnecessary etching of the wafer is prevented and the particle contaminations are removed more completely. The removal of particle contaminations prevents the particle contaminations from hitting a mask used in photolithography and from cracking the wafer, and prevents broken particle contaminations from scattering over the surface of the semiconductor layers.

The present invention is by no means limited to the above embodiment. For example, the above embodiment was arranged to perform the surface treatment step after the first epitaxial growth step, but a surface treatment step similar thereto may be further performed after the third epitaxial growth step. From the viewpoint of simplifying the production steps, the repetitive surface treatment steps with different thicknesses of the resist layer do not always have to be performed and the descum treatment may be omitted.

What is claimed is:

1. A method for producing a semiconductor optical device, the method comprising:
    a semiconductor layer growing step of epitaxially growing a plurality of semiconductor layers on one side of a semiconductor substrate;
    a mask layer forming step of forming a mask layer in a predetermined thickness on an outermost surface of the semiconductor layers so as to expose a tip side of a particle contamination exposing from the outermost surface;
    a particle contamination removing step of etching the particle contamination with a predetermined etchant, using the mask layer; and
    a mask layer removing step of removing the mask layer from the outermost surface, after etching the particle contamination,
    wherein the mask layer forming step comprises:
    a step of forming an insulating layer on the outermost surface of the semiconductor layers so as to cover the particle contamination;
    a step of applying a resist layer in a predetermined thickness on the insulating layer by a spinner so as to expose the tip side of the particle contamination covered by the insulating layer; and
    a step of etching the insulating layer, using the resist layer as a mask, to expose the tip side of the particle contamination from the insulating layer, and wherein
    the particle contamination removing step comprises removing the resist layer and thereafter etching the particle contamination with the predetermined etchant, using the insulating layer as the mask layer.

2. The method according to claim 1, wherein the mask layer forming step further comprises a step of descumming the tip side of the particle contamination, after forming the resist layer.

3. The method according to claim 1, wherein the mask layer forming step, the particle contamination removing step, and the mask layer removing step are repeated a plurality of times while stepwise decreasing the thickness of the mask layer formed on the outermost surface.

4. The method according to claim 1, wherein the mask layer forming step comprises a step of applying a resist layer in a predetermined thickness on the outermost surface of the semiconductor layers by a spinner, and
    wherein the particle contamination removing step comprises etching the particle contamination with the predetermined etchant, using the resist layer as the mask layer.

5. The method according to claim 4, wherein the mask layer forming step further comprises a step of descumming the tip side of the particle contamination, after forming the resist layer.

* * * * *